(12) United States Patent
Mattheis et al.

(10) Patent No.: US 7,348,647 B2
(45) Date of Patent: Mar. 25, 2008

(54) DIGITAL MEMORY CELL DEVICE

(75) Inventors: Roland Mattheis, Jena (DE); Hugo Van Den Berg, Diethoorn (NL)

(73) Assignee: Infineon Technologies AG (DE)

( * ) Notice: Subject to any disclaimer, the term of this patent is extended or adjusted under 35 U.S.C. 154(b) by 240 days.

(21) Appl. No.: 10/479,519

(22) PCT Filed: Jun. 14, 2002

(86) PCT No.: PCT/DE02/02187

§ 371 (c)(1),
(2), (4) Date: Apr. 30, 2004

(87) PCT Pub. No.: WO02/103702

PCT Pub. Date: Dec. 27, 2002

(65) Prior Publication Data

US 2004/0170054 A1    Sep. 2, 2004

(30) Foreign Application Priority Data

Jun. 15, 2001    (DE) ................................ 101 28 964

(51) Int. Cl.
*H01L 29/82* (2006.01)
(52) U.S. Cl. .............................. 257/421; 257/E29.167; 257/E29.323; 438/3; 360/324; 428/822.3; 428/822.4; 428/822.5
(58) Field of Classification Search ...... 428/811–811.5, 428/822.3–822, 822.4, 828, 822.5; 257/421, 257/E29.323, E29.167; 438/3; 360/324–324.2
See application file for complete search history.

(56) References Cited

U.S. PATENT DOCUMENTS

| | | | | |
|---|---|---|---|---|
| 4,780,848 A | * | 10/1988 | Daughton et al. | 365/173 |
| 5,428,585 A | * | 6/1995 | Hirokane et al. | 369/13.43 |
| 5,583,727 A | * | 12/1996 | Parkin | 360/324 |
| 5,585,986 A | * | 12/1996 | Parkin | 428/811.3 |
| 5,639,547 A | * | 6/1997 | Mitsuoka et al. | 428/332 |

(Continued)

FOREIGN PATENT DOCUMENTS

DE    19830343 C1 *    4/2000

(Continued)

OTHER PUBLICATIONS

Alvardo, S.F., Erbudak, M., Munz, P. "Final-state Effects In the 3d Photoelectron Spectrum of Fe3O4 and Comparison With FexO." Phys. Rev. B. vol. 14 (Oct. 1, 1976): pp. 2740-2745.*
German Search Report dated May 12, 2003, 9 pages.

*Primary Examiner*—Chandra Chaudhari
*Assistant Examiner*—Matthew W. Such
(74) *Attorney, Agent, or Firm*—Edell, Shapiro & Finnan, LLC

(57) ABSTRACT

A digital magnetic memory cell device for read and/or write operations, having a soft-magnetic read and/or write layer system and at least one hard-magnetic reference layer system, which is designed as an AAF system and includes at least one reference layer, wherein the reference layer system has a layer section comprising at least one bias layer system with at least one ferrimagnetic layer, the magnetic moments of the bias layer system and of the reference layer being coupled in opposite directions via a coupling layer.

13 Claims, 2 Drawing Sheets

U.S. PATENT DOCUMENTS

| | | | |
|---|---|---|---|
| 6,205,052 B1 * | 3/2001 | Slaughter et al. | 365/173 |
| 6,215,631 B1 * | 4/2001 | Fujikata et al. | 360/324.11 |
| 6,219,275 B1 * | 4/2001 | Nishimura | 365/173 |
| 6,233,172 B1 * | 5/2001 | Chen et al. | 365/173 |
| 6,292,389 B1 * | 9/2001 | Chen et al. | 365/158 |
| 6,303,218 B1 * | 10/2001 | Kamiguchi et al. | 428/332 |
| 6,338,899 B1 * | 1/2002 | Fukuzawa et al. | 360/324.12 |
| 6,348,274 B1 * | 2/2002 | Kamiguchi et al. | 428/811 |
| 6,385,082 B1 * | 5/2002 | Abraham et al. | 365/171 |
| 6,436,526 B1 * | 8/2002 | Odagawa et al. | 428/332 |
| 6,480,411 B1 * | 11/2002 | Koganei | 365/158 |
| 6,538,919 B1 * | 3/2003 | Abraham et al. | 365/171 |
| 6,567,246 B1 * | 5/2003 | Sakakima et al. | 360/324.11 |
| 6,721,144 B2 * | 4/2004 | Carey et al. | 360/324.11 |
| 2001/0020847 A1 * | 9/2001 | Mattheis et al. | 324/207.21 |
| 2001/0026471 A1 * | 10/2001 | Michijima et al. | 365/173 |
| 2002/0041515 A1 * | 4/2002 | Ikeda et al. | 365/158 |
| 2002/0154456 A1 * | 10/2002 | Carey et al. | 360/324.11 |

FOREIGN PATENT DOCUMENTS

| | | |
|---|---|---|
| EP | 0 783 112 A2 | 7/1997 |
| EP | 0 917 161 A1 | 5/1999 |
| WO | WO 00/02006 A2 * | 1/2000 |

* cited by examiner

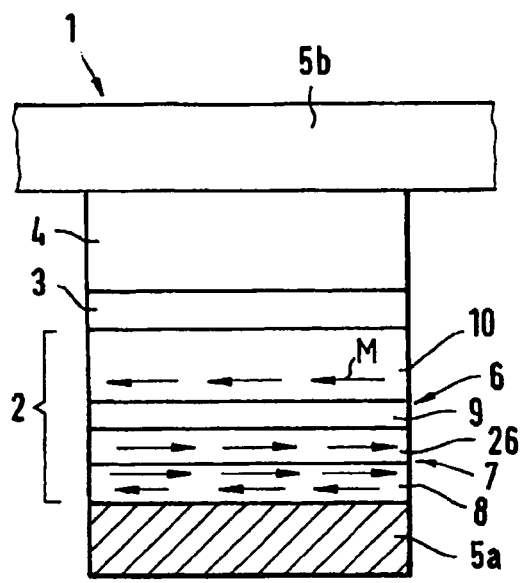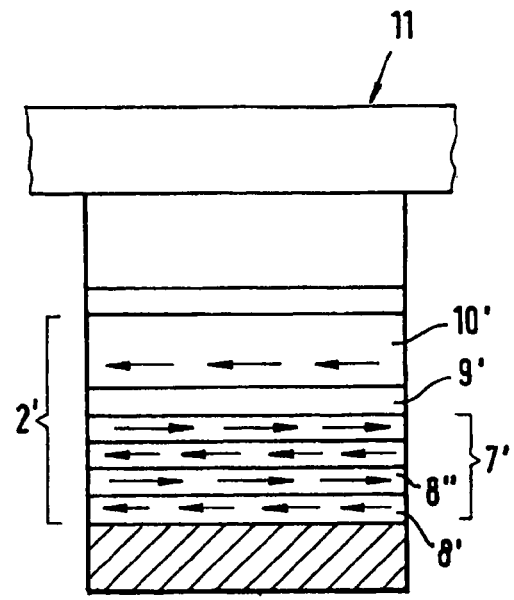
FIG 1
FIG 3
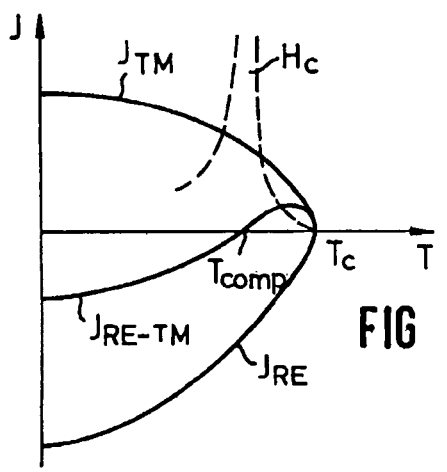
FIG 2
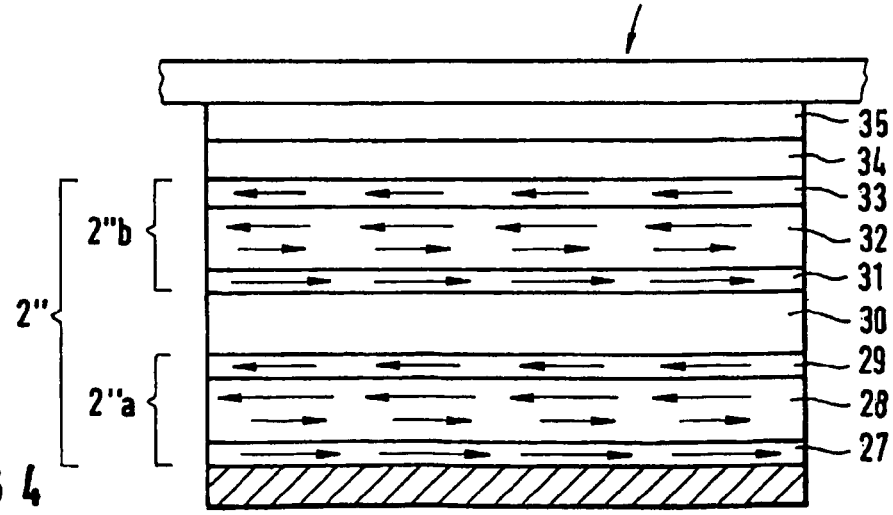
FIG 4

DIGITAL MEMORY CELL DEVICE

FIELD OF THE INVENTION

The invention relates to a digital memory cell device.

BACKGROUND

A digital memory cell device of this type is used to magnetically store information. An individual memory cell device is generally part of a memory device, often known as an MRAM (magnetic random access memory). Read and/or write operations can be carried out using a memory of this type. Each individual memory cell device comprises a soft-magnetic read and/or write layer systems which is separated by an interlayer from a hard-magnetic reference layer system, which in the present type of memory cell device is designed as an AAF system. The magnetization of the reference layer of the reference layer system is stable and does not change when a field is present, while the magnetization of the soft-magnetic read and/or write layer can be switched by the presence of a field. The two magnetic layer systems may be magnetized parallel or antiparallel to one another. The two abovementioned states in each case represent one bit of information, i.e., a logic zero ("0") or a logic one ("1"). If the relative orientation of the magnetization of the two layers changes from parallel to antiparallel, or vice versa, the magnetoresistance across this layer structure changes by a few percent. This change in the resistance can be used to read digital information stored in the memory cell. The change in the cell resistance can be detected by a change in voltage. By way of example, in the event of an increase in the voltage, the cell may be occupied with a logic zero ("0"), and in the event of a decrease in the voltages the cell may be occupied with a logic one ("1"). Particularly large resistance changes in the region of a few percent were observed when the magnetization orientation changed from parallel to antiparallel and vice versa in cell structures of the GMR (giant magnetoresistance) type or the TMR (tunnel magnetoresistance) type.

An important advantage of magnetic memory cells of this type is that information is stored permanently and remains stored without any basic power supply being maintained, even when the appliance is switched off, and is immediately available again once the appliance has been switched on, unlike in known conventional semiconductor memories.

A central component is the reference layer system, which is designed as an AAF system (AAF=artificial antiferromagnetic). An AAF system of this type is advantageous on account of its high magnetic rigidity and the relatively low coupling to the measurement layer system as a result of what is known as the orange peel effect and/or as a result of macroscopic magnetostatic coupling fields. An AAF system generally comprises a first magnetic layer or magnetic layer system, an antiferromagnetic coupling layer and a second magnetic layer or magnetic layer system, which is coupled with its magnetization across the antiferromagnetic coupling layer directed oppositely to the magnetization of the lower magnetic layer. An AAF system of this type may, for example, be formed from two magnetic Co layers and an antiferromagnetic coupling layer comprising Cu.

To improve the strength of the AAF system, i.e. its resistance to external fields, it is customary for an antiferromagnetic layer to be arranged on the magnetic layer of the AAF system which is remote from the measurement layer system. Via this antiferromagnetic layer, the magnetization of the directly adjacent magnetic layer is additionally pinned, so that overall the AAF system becomes harder (exchange pinning or exchange biasing).

However, a drawback in this context is the relatively weak coupling between the antiferromagnetic layer and the magnetic layer arranged thereon, which is typically less than 0.3 mJ/m$^2$. A further drawback is that the magnetization of a bias layer system consisting of the antiferromagnetic layer and the AAF system cannot easily be adjusted. This requires the temperature of the bias layer system to be increased above what is known as the blocking temperature of the antiferromagnetic layer, so that the coupling is eliminated, while at the same time a strong external field has to be applied and cooling has to take place in this field. This causes problems in particular for Wheatstone bridge circuits with oppositely oriented AAF systems. Difficulties also occur if the thicknesses of the magnetic layers of the AAF system are approximately identical, since the AAF system then has no net moment or only a minimal net moment and can only be adjusted with difficulty using the external field.

A further drawback of the use of an AAF system with antiferromagnetic layers is that the thickness of the antiferromagnetic layers must be great enough to achieve a sufficiently high blocking temperature. As a result, the distance between the lines which are required for reading and writing, run above and below the layer system and cross one another there, generally known as word and bit lines, increases, which leads to a decrease in the field strength of the energized conductors at the soft-magnetic read and/or write layer system which may have to be switched thereby.

SUMMARY

The invention is based on the problem of providing a memory cell device which is easy to adjust with regard to the magnetization of the reference layer system and has a lower layer system height.

To solve this problem, in a digital memory cell device of the type described in the introduction, it is provided, according to the invention, that the reference layer system has a layer section comprising at least one bias layer system with at least one ferrimagnetic layer, the magnetic moments of the bias layer system and of the reference layer being coupled in opposite directions via a coupling layer.

The invention advantageously proposes the use of a bias layer system having at least one ferrimagnetic layer, the magnetic moments of this bias layer system and/or of the ferrimagnetic layer being coupled to those of the reference layer, thereby forming the reference layer system. A ferrimagnetic layer is distinguished by the fact that it comprises at least two magnetic sublattices, the magnetic moments of which are oriented antiparallel as in the antiferromagnet. However, the magnetic moments do not completely compensate for one another, so that a net magnetic moment results. Accordingly, to external appearances a ferrimagnet behave like a ferromagnet, except that the level of the saturation magnetization is generally low and the temperature dependency of the saturation is greater. Since the temperature profile of the magnetization of the sublattices is generally different and the sublattices are coupled antiferromagnetically (=antiparallel) to one another, in ferrimagnets there is a temperature at which the moments cancel one another out (i.e. are equal and antiparallel) and the net moment disappears. This temperature is known as the compensation temperature. In the vicinity of the compensation temperature, therefore, the ferrimagnetic layer has only a minimal net magnetic moment or ideally no net magnetic moment. While the magnetization of the ferrimagnetic layer can be adjusted by means of a relatively low external field outside the compensation temperature window, and thereby so can the orientation of the coupled fixing layer, in the vicinity of the compensation temperature, the magnetization of the ferrimagnetic layer is extremely stable, on account of the absence of a net magnetic moment. If, by suitable selection of materials, the compensation temperature of the ferrimagnetic layer is set such that it is in the vicinity of the operating temperature of the memory cell device, the result is an extremely stable bias layer system. Adjustment of the magnetization of the bias layer system can be achieved without problems by increasing or reducing the temperature to a range which lies outside this compensation temperature. The temperature change may take place in both directions, since the magnetic moment of a ferrimagnetic material is normally reversed on passing through the compensation temperature.

A further advantage of the use of the ferrimagnetic layer within the reference layer system is that the coupling to the reference layer of a connected AAF system can be selected to be very high, specifically of an order of magnitude of approximately 10 mJ/m$^2$. This means that the reference layer system can be made very stable with respect to external fields.

Furthermore, the ferrimagnetic layer may be significantly thinner than the antiferromagnetic layer which has been used hitherto and which has to be relatively thick in order to achieve a high blocking temperature, and consequently the thickness of the entire memory cell device can be reduced. The word and bit lines of a memory cell device lie closer together, so that a sufficiently high field can be applied to the soft-magnetic read and write layer system. Distance-related losses can be avoided.

Overall, in this way it is possible to obtain an extremely stable memory cell device which is of reduced thickness and, despite everything, can easily be adjusted with regard to the bias layer magnetization. This is also true of a memory device formed from a multiplicity of memory cell devices of this type.

According to the invention, the ferrimagnetic layer may consist of an alloy of a magnetic transition metal and a rare earth. Alternatively, the ferrimagnetic layer may also be a multilayer system comprising a magnetic transition metal and a rare earth. The transition metal used may, for example, be iron (Fe) or cobalt (Co), and the rare earth used may, for example, be samarium (Sm), europium (Eu), gadolinium (Gd) or terbium (Tb).

For strong and stable coupling of the moments of the respectively coupled layers, it is expedient if this takes place by means of an RKKY coupling (RKKY=Ruderman-Kittel-Kasuya-Yosida).

The net magnetic moment of the reference layer system, which forms an AAF system, should be extremely low in the operating window of the memory cell device. With a view to the highest possible stability which can be achieved, an overall moment of zero is most expedient.

It is particularly advantageous if at least one layer of the reference layer system has a uniaxial anisotropy, along which the magnetization is oriented in the operating temperature window. The anisotropy leads to a further strengthening of the system. The uniaxial anisotropy can be induced in the direction of a slight axis of the memory cell device, which for its part is determined by the geometry and orientation of the memory cell device.

In the context of a first configuration of the invention, the uniaxial anisotropy can be produced by inclined deposition of one or all of the layers of the reference layer system. In this case, by way of example, the layers are vapor-deposited at an angle with respect to the plane of the substrate.

As an alternative or in addition, the uniaxial anisotropy may also be produced by impressing a preferential direction in a magnetic field which is present during the production of the layer system. In this case, the direction of the magnetic field which is present determines the preferential direction of the layer system produced.

A further possibility for producing the anisotropy is a seed layer on which the reference layer system is grown. This seed layer itself has a pronounced direction, which is transferred to the growing layer system and defines the preferential direction or the slight direction.

A further possibility is to produce the uniaxial anisotropy by impressing a preferential direction during a thermal annealing phase in a magnetic field.

Another possibility for producing the anisotropy provides for the at least one layer or all the layers of the reference layer system, preferably the ferrimagnetic layer thereof, to have a high magnetostriction coefficient. In this case, the uniaxial anisotropy can be produced by anisotropic strain relaxation. In this context, it is expedient if the crystallites of the or all the layers of the reference layer system, or at least the crystallites of the ferrimagnetic layer, are elongated in form.

Finally, another possibility for producing the anisotropy consists in providing at least one strain or deformation layer in order to boost anisotropic strain relaxation. This layer may, for example, consist of $SiO_2$. The preferential direction is induced by the stresses in the layer system which are induced in this way on account of the different thermal expansion characteristics.

It will be understood that it is, of course, also possible for two or more of the above-described possibilities for producing anisotropy to be deployed simultaneously Finally, a decoupling layer system which decouples a soft-magnetic multilayer system and a reference layer system may be a metal layer or an insulating layer or a semiconductor layer.

The memory cell device itself may be a giant-magnetoresistive, a magnetic-tunnel-junction or a spin-valve-transistor system.

Finally, in additional to the memory cell device itself, the invention also relates to a digital memory device comprising a plurality of memory cell devices of the type described arranged in the form of an array or a matrix.

BRIEF DESCRIPTION OF THE DRAWINGS

Further advantages, features and details of the invention will emerge from the exemplary embodiments described below and with reference to the drawings, in which:

FIG. 1 shows an outline drawing of a first embodiment of a memory cell device according to the invention, FIG. 2 shows a diagram illustrating the temperature-dependent magnetization curve of a ferrimagnet, FIG. 3 shows a second embodiment of a memory cell device according to the invention, with a multilayer bias layer system, FIG. 4 shows an outline drawing of a third embodiment of a memory cell device according to the invention with a multilayer AAF reference layer system.

DETAILED DESCRIPTION

Figure 5:
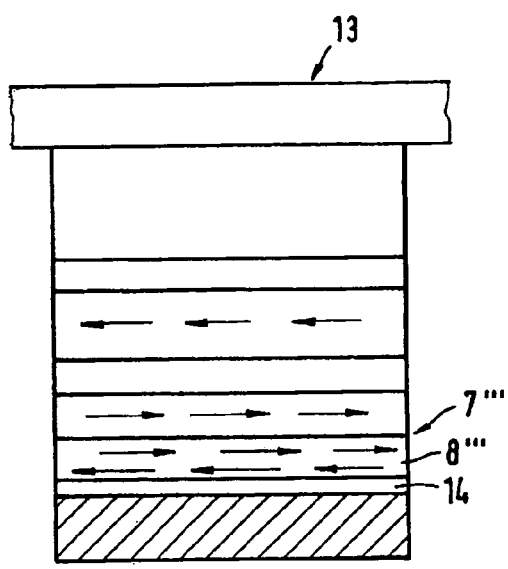
FIG. 5 shows an outline drawing of a fourth embodiment of a memory cell device according to the invention, with a seed layer for producing anisotropy.

FIG. 1 shows a first embodiment of a memory cell device 1 according to the invention. It comprises a reference layer system 2, which is decoupled from a read and write layer system 4 by means of a decoupling layer 3. The figure also shows the word and bit lines 5a, 5b, which run at right angles to one another above and below. The reference layer system 2 comprises a layer section 6 which includes a lower bias layer system 7, which in the exemplary embodiment shown comprises a ferrimagnetic layer 8 and a ferromagnetic layer 26 coupled thereto. In the example shown, the ferrimagnetic layer 8 is an alloy layer. The alloying components which may be used are a transition metal, e.g., Fe, Co, Ni, and a rare earth, e.g., Gd, Dy, Tb. Two magnetic sublattices with opposite magnetic moments M are formed within the ferromagnetic layer 8, as indicated in FIG. 1 by the oppositely directed arrows. However, the magnetic moments of the two sublattices differ with regard to number and/or strength, i.e., they do not compensate for one another apart from within a narrow compensation temperature range. The result is a net moment of the bias layer system 7 in the range outside the compensation temperature range. This will be dealt with in more detail below.

The net magnetic moment of the bias layer system 7 is coupled antiparallel to the magnetic moments M of a reference layer 10 via an antiferromagnetic coupling layer system 9. This means that the magnetic moments M and therefore the magnetization of the reference layer 10 is directed oppositely to the resulting net moment of the bias layer system 7. Overall, the reference layer system 2 forms an AAF system. The coupling between the magnetization of the bias layer system 7, i.e., the ferrimagnetic layer 8, the ferromagnetic layer 26 and the magnetization of the reference layer 10 is very great, i.e., the magnetization of the reference layer 10 is very stably oriented. This bias layer system 7 or the ferrimagnetic layer 8 itself has a uniaxial anisotropy along which the magnetizations of the sublattices are oriented. This anisotropy leads to the magnetization of the bias layer system 7 itself being very stable, which in turn leads to stability of the entire reference layer system.

FIG. 2 describes the curve of the temperature-dependent magnetization of the ferrimagnetic layer 8. The prevailing temperature is plotted on the abscissa, and the corresponding magnetization of the sublattice of the transition metal component ($J_{TM}$), the magnetization of the rare earth component ($J_{RE}$) and the resulting net magnetization ($J_{RE-TM}$) are plotted on the ordinate.

It can be seen from the curve of the net magnetization $J_{RE-TM}$ that in the exemplary embodiment shown, on account of the greater magnetization $J_{RE}$ of the rare earth component, the result is an overall magnetizations which decreases as the temperature rises. At a compensation temperature $T_{comp}$, however, the total magnetization is zero, i.e., the magnetizations $J_{RE}$ and $J_{TM}$ are equal and oppositely oriented. As the temperature rises further, the magnetization $J_{TM}$ dominates. The overall magnetization breaks down when the Curie point $T_C$ is reached.

Furthermore, it can be seen that the cohesive field strength $H_c$ rises very strongly around this compensation temperature $T_{comp}$ or is infinite at the compensation temperature $T_{comp}$, on account of the net moment of zero which is present at this temperature.

According to the invention, the ferrimagnetic layer 8 is selected in such a way with regard to the materials used, their dimensions and geometry, etc., that the region around the compensation temperature $T_{comp}$ lies within or coincides with the operating temperature range within which the memory device 1 is operated, i.e., during normal operation of the memory cell device, the overall magnetic moment of the ferrimagnetic layer is approximately zero, i.e., the layer is very stable with respect to an external field which is present, since the cohesive field strength $H_c$ is very high. This means that the coupling to the reference layer 10 is also very stable, since the ferrimagnetic layer 8 which is responsible for the coupling or the bias layer system 7 does not change within the field which is present.

A further advantage is that the orientation of the magnetization of the reference layer 10 is relatively simple. It is known that in memory cell devices of this type, the magnetization of the reference layer 10 must be very stable. The signal whose level is a measure of the written information is known to be dependent on the direction of the magnetization of the soft-magnetic measurement layer system, which can be turned very easily in the external magnetic field which is present and is to be measured with regard to the direction of the fixed, hard magnetization of the reference layer 10. Consequently, it is necessary to adjust this magnetization of the reference layer 10.

In the memory cell device according to the invention, this orientation is relatively simple on account of the use of the ferrimagnetic layer 8. For this purpose, it is merely necessary to increase or reduce the temperature to such an extent that there is a movement sufficiently far out of the region around the compensation temperature $T_{comp}$, so that a net moment results. The magnetization of the ferrimagnetic layer can now be adjusted by means of a relatively low external field, especially since the cohesive field strength of a ferrimagnetic layer is relatively low. On account of the resulting coupling to the reference layer 10, the magnetization of this layer is once again set to be antiparallel. By simple, slight temperature increase or reduction using a small adjustment field, therefore, it is possible for the magnetization of the ferrimagnetic layer to be adjusted to the desired direction, in which the ferrimagnetic layer preferably has a uniaxial anisotropy. It is not necessary, as in the prior art using a natural antiferromagnet with applied AAF system, to run up a high temperature in order to exceed the blocking temperature and then to carry out cooling in a high external magnetic field.

FIG. 3 shows a further memory cell device 11 according to the invention. In this case too, there is a reference layer system 2', comprising a bias layer system 7', an antiferromagnetic coupling layer 9' and a reference layer 10'. Unlike in the bias layer system 7 shown in FIG. 1, the bias layer system 7' is a multilayer system comprising separate layers 8', 8", one layer 8' being formed, for example, by the transition metal and the layer 8" being formed by the rare earth. However, the method of operation and the properties of this bias layer system 7' are the same as in the system shown in FIG. 1.

FIG. 4 shows an outline drawing of a memory cell device 12 with a multilayer reference layer system 2". It comprises a lower layer section 2"a comprising a lower ferromagnetic layer 27 (e.g. Co), a ferrimagnetic layer 28 (e.g. CoTb) and an upper ferromagnetic layer 29 (e.g. Co). An upper layer section 2"b is coupled by means of its lower ferromagnetic layer 31 (e.g. Co) via an antiferromagnetically coupling interlayer 30 (e.g. Cu or Ro). A ferrimagnetic layer 32 (e.g. CoTb) is in turn applied to the layer 31, and a ferromagnetic layer 33 (e.g. Co) is applied to the ferrimagnetic layer 32. Finally, the actual read and write layer system 35 is decoupled via a decoupling layer 34. The overall reference layer structure forms an AAF system.

Finally, FIG. 5 shows a further memory cell device 13 according to the invention, the structure of which, in the exemplary embodiment shown, corresponds to that shown in FIG. 1. In this case, to produce anisotropy in the bias layer system 7''', there is a seed layer 14, on which the bias layer system 7''' or the ferrimagnetic layer 8''' is deposited. The seed layer has a preferential direction or anisotropy which is transferred to the ferrimagnetic layer 8''' during the layer growth. The magnetization of the respective sublattices is preferentially established along this anisotropy or slight direction.

A further possible way of producing this anisotropy is described with reference to the memory cell device 15 shown in FIG. 6, the structure of which is similar to that shown in FIG. 5. In this case, however, a strain layer 16, e.g., comprising $SiO_2$, which induces uniaxially oriented stresses in the ferrimagnetic layer, which in turn induce uniaxial anisostropy, is applied to the bias layer 7'''' or the ferrimagnetic layer 8'''' instead of the seed layer 14 (which of course could also be provided).

Figure 6:
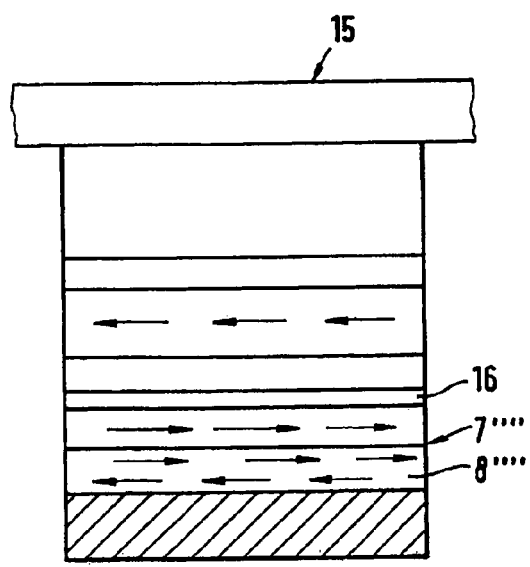
FIG. 6 shows an outline drawing of a fifth embodiment of a memory cell device according to the invention with a strain layer for producing the anisotropy.

In addition to the possible ways of inducing or producing uniaxial anisotropy which have been described in FIGS. 5 and 6, it is, of course, also possible for this anisotropy to be produced by inclined deposition of the ferrimagnetic layer or by impressing a preferential direction in a field which is present, if appropriate during a thermal annealing step or using a ferrimagnetic layer with a high magnetostriction coefficient and if appropriate correspondingly shaping the layer grains. The person skilled in the art knows of sufficient possible ways of producing anisotropy and can use all these options individually or in combination.

A number of implementations have been described. Nevertheless, it will be understood that various modifications may be made without departing from the spirit and scope. Accordingly, other implementations are within the scope of the following claims.

The invention claimed is:

1. A digital magnetic memory cell device for read/write operations comprising:
   a soft-magnetic read/write layer system; and
   a hard-magnetic reference layer system formed as an AAF system including:
      a bias layer system comprising:
         at least one ferromagnetic layer, and
         at least one ferrimagnetic layer applied to the ferromagnetic layer,
      a magnetic reference layer, and
      an anti-ferromagnetic layer coupling the bias layer system to the magnetic reference layer,
   wherein the at least one ferrimagnetic layer comprises a first ferrimagnetic layer formed from a transition metal and a second ferrimagnetic layer formed from a rare earth element.

2. The cell device of claim 1, wherein the ferrimagnetic layer possesses an overall magnetic moment of approximately zero during the normal operational temperature window of the memory cell device.

3. The memory cell device of claim 1, comprising, in order, the magnetic reference layer, the anti-ferromagnetic layer, the ferrimagnetic layer, and the ferrimagnetic layer.

4. A digital magnetic memory cell device comprising:
   a soft-magnetic read/write layer system; and
   a hard-magnetic reference layer system comprising:
      a first layer section including a first ferrimagnetic layer disposed adjacent a second ferrimagnetic layer, wherein the first ferrimagnetic layer comprises a transition metal and the second ferrimagnetic layer comprises a rare earth element; and
      a second layer section including a reference layer having a stable magnetization, and
      an antiferromagnetic layer coupling the first layer section to the second layer section.

5. The memory cell device of claim 4, wherein:
   the transition metal is selected from the group consisting of Fe, Co, and Ni; and
   the rare earth element is selected from the group consisting of Sm, Eu, Gd, Dy, and Tb.

6. A digital magnetic memory cell device for read/write operations comprising:
   a soft-magnetic read/write layer system; and
   a hard-magnetic reference layer system formed as an AAF system including:
      a bias layer system comprising:
         at least one ferromagnetic layer, and
         at least one ferrimagnetic layer applied to the ferromagnetic layer,
      a magnetic reference layer, and
      an anti-ferromagnetic layer coupling the bias layer system to the magnetic reference layer,
   wherein:
      the at least one ferrimagnetic layer comprises a first ferrimagnetic layer formed from a transition metal and a second ferrimagnetic layer formed from a rare earth element, and
      the ferrimagnetic layer possesses an overall magnetic moment of approximately zero during the normal operational temperature window of the memory cell device.

7. A digital magnetic memory cell device for read/write operations comprising:
   a soft-magnetic read and/or write layer system;
   a hard-magnetic reference layer system formed as an AAF system including:
      a first layer section comprising:
         a first lower ferromagnetic layer,
         a first upper ferromagnetic layer, and
         a first ferrimagnetic layer disposed between the upper ferromagnetic layer and the lower ferromagnetic layer, and
      a second layer section comprising:
         a second lower ferromagnetic layer,
         a second upper ferromagnetic layer, and
         a second ferrimagnetic layer disposed between the upper ferromagnetic layer and the lower ferromagnetic layer; and
      an antiferromagnetic layer coupling the first layer section to the second layer section.

8. The memory cell device of claim 7, wherein the ferrimagnetic layers comprise:
   a transition metal selected from the group consisting of Fe, Co, and Ni;
   a rare earth element selected from the group consisting of Sm, Eu, Gd, Dy, and Tb; or
   an alloy of the transition metal and rare earth element.

9. The memory cell device of claim 7, wherein:
   the ferromagnetic layers comprise Co;
   the ferrimagnetic layer comprises CoTb;
   the antiferromagnetic layer comprises Cu.

10. A digital magnetic memory cell device for read/write operations comprising:
- a soft-magnetic read/write layer system; and
- a hard-magnetic reference layer system formed as an AAF system including:
  - a reference layer having a plurality of magnetic moments,
  - an anti-ferromagnetic coupling layer system, and
  - a bias layer system having a plurality of magnetic moments, wherein the bias layer system includes:
    - at least one ferromagnetic layer, and
    - at least one ferrimagnetic layer coupled to the ferromagnetic layer, wherein the at least one ferrimagnetic layer possesses an overall magnetic moment of approximately zero during normal operation of the memory cell device,
  - wherein the magnetic moments of the bias layer system are coupled antiparallel to the magnetic moments of the reference layer, and wherein the at least one ferrimagnetic layer comprises an alloy of a transition metal selected from the group consisting of Fe, Co, and Ni, and a rare earth element selected from the group consisting of Sm, Eu, Gd, Dy, and Tb.

11. A digital magnetic memory cell device for read/write operations comprising:
- a soft-magnetic read/write layer system; and
- a hard-magnetic reference layer system formed as an AAF system including:
  - a reference layer having a plurality of magnetic moments,
  - an anti-ferromagnetic coupling layer system, and
  - a bias layer system having a plurality of magnetic moments, the bias layer system including:
    - at least one ferromagnetic layer, and
    - at least one ferrimagnetic layer coupled to the ferromagnetic layer, the at least one ferrimagnetic layer possessing an overall magnetic moment of approximately zero during normal operation of the memory cell device,
  - wherein the magnetic moments of the bias layer system are coupled antiparallel to the magnetic moments of the reference layer, and wherein the at least one ferrimagnetic layer comprises a first ferrimagnetic layer comprising a transition metal selected from the group consisting of Fe, Co, and Ni, and a second ferrimagnetic layer comprising a rare earth element selected from the group consisting of Sm, Eu, Gd, Dy, and Tb.

12. A digital magnetic memory cell device comprising:
- a soft-magnetic read/write layer system; and
- a hard-magnetic reference layer system comprising:
  - a first layer section including:
    - a ferrimagnetic layer, and
    - a ferromagnetic layer coupled to the ferrimagnetic layer,
  - a second layer section including a reference layer having a stable magnetization, and
  - an antiferromagnetic layer coupling the first layer section to the second layer section,
- wherein the ferrimagnetic layer comprises:
  - a transition metal selected from the group consisting of Fe, Co, and Ni; or
  - a rare earth element selected from the group consisting of Sm, Eu, Gd, Dy, and Tb.

13. A digital magnetic memory cell device comprising:
- a soft-magnetic read/write layer system; and
- a hard-magnetic reference layer system comprising:
  - a first layer section including:
    - a ferrimagnetic layer, and
    - a ferromagnetic layer coupled to the ferrimagnetic layer,
  - a second layer section including a reference layer having a stable magnetization, and
  - an antiferromagnetic layer coupling the first layer section to the second layer section, wherein the ferrimagnetic layer comprises an alloy layer including at least one transition metal selected from the group consisting of Fe, Co, and Ni and at least one rare earth element selected from the group consisting of Sm, Eu, Gd, Dy, and Tb.

* * * * *

UNITED STATES PATENT AND TRADEMARK OFFICE
CERTIFICATE OF CORRECTION

PATENT NO. : 7,348,647 B2  Page 1 of 1
APPLICATION NO. : 10/479519
DATED : March 25, 2008
INVENTOR(S) : Roland Mattheis et al.

It is certified that error appears in the above-identified patent and that said Letters Patent is hereby corrected as shown below:

(75) Inventors (Hug Van Den Berg): "Diethoorn (NL)" should read --Giethoorn (NL)--

Signed and Sealed this

Ninth Day of February, 2010

David J. Kappos
*Director of the United States Patent and Trademark Office*